(12) United States Patent
Shome et al.

(10) Patent No.: US 11,841,628 B2
(45) Date of Patent: Dec. 12, 2023

(54) APPARATUS FOR AND METHOD OF SENSING ALIGNMENT MARKS

(71) Applicant: ASML Holding N.V., Veldhoven (NL)

(72) Inventors: Krishanu Shome, Cheshire, CT (US); Justin Lloyd Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/798,040

(22) PCT Filed: Jan. 21, 2021

(86) PCT No.: PCT/EP2021/051363
§ 371 (c)(1),
(2) Date: Aug. 5, 2022

(87) PCT Pub. No.: WO2021/156069
PCT Pub. Date: Aug. 12, 2021

(65) Prior Publication Data
US 2023/0116318 A1    Apr. 13, 2023

Related U.S. Application Data

(60) Provisional application No. 62/970,481, filed on Feb. 5, 2020.

(51) Int. Cl.
*G03F 7/00*    (2006.01)
*G03F 9/00*    (2006.01)

(52) U.S. Cl.
CPC ........ *G03F 9/7088* (2013.01); *G03F 7/70633* (2013.01); *G03F 9/7046* (2013.01); *G03F 9/7049* (2013.01); *G03F 9/7069* (2013.01)

(58) Field of Classification Search
CPC .. G03F 7/70633; G03F 9/7046; G03F 9/7049; G03F 9/7069; G03F 9/7088
See application file for complete search history.

(56) References Cited

U.S. PATENT DOCUMENTS 4,600,309 A    7/1986  Fay
6,297,876 B1   10/2001 Bornebroek
(Continued)

FOREIGN PATENT DOCUMENTS

EP    1 372 040 A2    12/2003
JP    H10-022207 A     1/1998
(Continued)

OTHER PUBLICATIONS

International Search Report and Written Opinion of the International Searching Authority directed to related International Patent Application No. PCT/EP2021/051363, dated May 6, 2021; 10 pages.
(Continued)

*Primary Examiner* — Peter B Kim
(74) *Attorney, Agent, or Firm* — Sterne, Kessler, Goldstein & Fox P.L.L.C.

(57) ABSTRACT

An apparatus for and method of sensing multiple alignment marks in which the optical axis of a detector is divided into multiple axes each of which can essentially simultaneously detect a separate alignment mark to generate a signal which can then be multiplexed and presented to a single detector or multiple detectors thus permitting more rapid detection of multiple marks.

20 Claims, 8 Drawing Sheets

(56) References Cited

U.S. PATENT DOCUMENTS

| | | | |
|---|---|---|---|
| 6,961,116 | B2 | 11/2005 | Den Boef et al. |
| 8,610,898 | B2 | 12/2013 | Khuat Duy |
| 9,778,025 | B2 | 10/2017 | Mathijssen et al. |
| 10,466,601 | B2 | 11/2019 | Polo et al. |
| 11,086,240 | B2 | 8/2021 | Goorden et al. |
| 2006/0250597 | A1 | 11/2006 | Nakajima |
| 2009/0169662 | A1 | 7/2009 | Nimmakayala et al. |
| 2010/0195102 | A1* | 8/2010 | Den Boef ............. G03F 9/7003 425/150 |
| 2018/0329307 | A1 | 11/2018 | Brinkhof et al. |
| 2018/0329316 | A1* | 11/2018 | Polo ..................... G02B 27/141 |
| 2019/0086824 | A1 | 3/2019 | Mathijssen et al. |

FOREIGN PATENT DOCUMENTS

| | | | |
|---|---|---|---|
| JP | 2005026287 A | * | 1/2005 |
| JP | 2015-528584 A | | 9/2015 |
| JP | 2017215429 A | * | 12/2017 |
| JP | 2020-502580 A | | 1/2020 |
| WO | WO 2018/041440 A1 | | 3/2018 |
| WO | WO 2020/038629 A1 | | 2/2020 |
| WO | WO 2020/064290 A1 | | 4/2020 |

OTHER PUBLICATIONS

International Preliminary Report on Patentability directed to related International Patent Application No. PCT/EP2021/051363, dated Jul. 28, 2022; 8 pages.

Research Disclosure No. 676037, "Lithographic Apparatus, Metrology Systems, Illumination Switches and Methods Thereof," Jul. 7, 2020; 50 pages.

Notice of Reasons for Rejection directed to Japanese Patent Application No. 2022-543086, dated Sep. 1, 2023; 8 pages.

* cited by examiner

APPARATUS FOR AND METHOD OF SENSING ALIGNMENT MARKS

CROSS-REFERENCE TO RELATED APPLICATIONS

This application claims priority of U.S. Provisional Patent Application No. 62/970,481, which was filed on Feb. 5, 2020, and which is incorporated herein in its entirety by reference.

FIELD

The present disclosure relates to the manufacture of devices using lithographic techniques. Specifically, the present disclosure relates to the sensing and analysis of alignment marks on substrates to characterize and control semiconductor photolithographic processes.

BACKGROUND

A lithographic apparatus can be used, for example, in the manufacture of integrated circuits (ICs). For that application, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

ICs are built up layer by layer, and modern ICs can have 30 or more layers. On Product Overlay (OPO) is a measure of a system's ability to print these layers accurately on top of each other. Successive layers or multiple processes on the same layer must be accurately aligned to the previous layer. Otherwise, electrical contact between structures will be poor and the resulting devices will not perform to specification. Good overlay improves device yield and enables smaller product patterns to be printed. The overlay error between successive layers formed in or on the patterned substrate is controlled by various parts of the exposure apparatus of the lithographic apparatus.

Process-induced wafer errors are a significant impediment to OPO performance. Process-induced wafer errors are attributable to the complexity of printed patterns as well as an increase of the number of printed layers. This error is of relatively high spatial variation that is different from wafer to wafer, and within a given wafer.

In order to control the lithographic process to place device features accurately on the substrate, one or more alignment marks are generally provided on, for example, the substrate, and the lithographic apparatus includes one or more alignment sensors by which the position of the mark may be measured accurately. The alignment sensor may be effectively a position measuring apparatus. Different types of marks and different types of alignment sensors are known from different times and different manufacturers. Measurement of the relative position of several alignment marks within the field can correct for process-induced wafer errors. Alignment error variation within the field can be used to fit a model to correct for OPO within the field Lithographic apparatus are known to use multiple alignment systems to align the substrate with respect to the lithographic apparatus. The data can for example be obtained with any type of alignment sensor, for example a SMASH (SMart Alignment Sensor Hybrid) sensor, as described in U.S. Pat. No. 6,961,116, issued Nov. 1, 2005 and titled "Lithographic Apparatus, Device Manufacturing Method, and Device Manufactured Thereby," which is hereby incorporated by reference herein in its entirety, that employs a self-referencing interferometer with a single detector and four different wavelengths, and extracts the alignment signal in software, or ATHENA (Advanced Technology using High order ENhancement of Alignment), as described in U.S. Pat. No. 6,297,876, issued Oct. 2, 2001 and titled "Lithographic Projection Apparatus with an Alignment System for Aligning Substrate on Mask," which is hereby incorporated by reference in its entirety, which directs each of seven diffraction orders to a dedicated detector, or the ORION sensor which uses multiple polarizations per available signal (color).

Reference is made in particular to the European application No. EP 1 372 040 A1, granted Mar. 5, 2008 and titled "Lithographic Apparatus and Device Manufacturing Method" which document is hereby incorporated by reference in its entirety. EP 1 372 040 A1 describes an alignment system using a self-referencing interferometer that produces two overlapping images of an alignment marker. These two images are rotated over 180° with respect to each other. EP 1 372 040 A1 further describes the detection of the intensity variation of the interfering Fourier transforms of these two images in a pupil plane. These intensity variations correspond to a phase difference between different diffraction orders of the two images, and from this phase difference positional information is derived, which is required for the alignment process. Reference is also made to U.S. Pat. No. 8,610,898, "Self-Referencing Interferometer, Alignment System, and Lithographic Apparatus" issued Dec. 17, 2013, the entire contents of which are hereby incorporated by reference in their entirety.

Alignment sensors such as SMASH, Athena, and ORION currently measure alignment marks in the form of scribe lane marks to find the alignment position. The wafer grid is determined from this alignment position. An accurate wafer grid reduces the potential for overlay errors. A dense sample of alignment marks can help reduce intrafield errors.

There are thus potential benefits from being able to measure a greater number of marks such as, for example, the ability to align out intra-field issues. Typically conventional sensors, however, are limited to measuring about forty mark pairs because they measure marks serially one after the next and measuring a greater number of pairs incurs an unacceptable time penalty. The ability to mitigate this time penalty by increasing scan speed is limited because increasing scan speed causes dynamics issue.

It is thus desirable to be able to measure more alignment marks without having to increase scan speed.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to an aspect of an embodiment, the optical axis of the sensor is divided such that the sensor can simultaneously gather information from multiple positions on the wafer. The axis of an alignment sensors can be conceptualized as an imaginary line around which the rotation of the image occurs. The alignment sensors make their measurements with respect to this axis. For systems such as SMASH and ORION sensor which include an interferometer in the form of a self-referencing interferometer, this axis may be projected back from the self-referencing interferometer to the wafer through the objective lens of the optical system used to gather light diffracted by the alignment mark.

According to an aspect of an embodiment the axis of the interferometer is split up, for example, by beam splitters into multiple different axes. The axis may, for example, be split into three axes, although this is just an example and the axis could be split into a greater number of axes. Each of the multiple axes have their own objective and may have their own illumination. The signals from respective alignment marks reach a common detector. The signals are demultiplexed to separate the alignment information from the three alignment marks on the wafer.

According to one aspect of an embodiment there is disclosed an apparatus for sensing a plurality of alignment marks, the apparatus comprising an illumination system arranged to provide a plurality of light beams to illuminate respective ones of the plurality alignment marks, a diffracted light gathering optical system arranged to gather diffracted light from a plurality of diffracted light beams diffracted from respective ones of the plurality of alignment marks, an interferometer arranged to receive the diffracted light gathered by the light gathering system and configured to generate an optical output based on the diffracted light, and a detection system arranged to receive the optical output of the and configured to generate an electrical signal based on the optical output. The illumination system may comprise an illumination source for generating a source light beam and a plurality of beam splitters arranged to receive the source light beam, to transmit a transmitted portion of the source light beam, and to redirect a redirected portion of the source light beam towards a respective one of the plurality of alignment marks. The illumination system may be arranged to provide the plurality of light beams to provide on-axis illumination of respective ones of the plurality alignment marks. The illumination system may be arranged to provide the plurality of light beams to provide off-axis illumination of respective ones of the plurality alignment marks. The plurality of alignment marks may comprise a first pair of alignment marks each comprising a first grating having a first pitch and a second pair of alignment marks each comprising a second grating having a second pitch different from the first pitch, in which case the apparatus may further comprise a demultiplexer configured to demultiplex light diffracted by the first grating and light diffracted by the second grating based on the second pitch being different from the first pitch. The demultiplexer may be configured to demultiplex light diffracted by the first grating and light diffracted by the second grating by shifting a pupil position of the light diffracted by the first grating with respect to a pupil position of the light diffracted by the second grating.

A first optical output of the light diffracted by the first grating demultiplexer may have a first frequency and a second optical output of the light diffracted by the second grating demultiplexer may have a second frequency different from the first frequency in which case the demultiplexer may be configured to demultiplex light diffracted by the first grating and light diffracted by the second grating based on first and second frequency. The apparatus may further comprise an arrangement for causing relative motion of the plurality of alignment marks and the diffracted light gathering optical system and a demultiplexer configured to demultiplex light diffracted by the plurality of alignment marks based on a timing of receipt of the optical signal by the detection system. The diffracted light gathering optical system may further comprise optical components arranged to create a lateral, with respect to a direction of propagation, physical separation between the respective diffracted light beams in which case the apparatus may further comprise a demultiplexer configured to demultiplex light diffracted by the plurality of alignment marks based on a lateral position of the light diffracted by the plurality of alignment marks. The illumination system may comprise a plurality of illumination sources arranged to provide a respective one of the plurality of light beams to illuminate a respective one of the plurality of alignment marks. The apparatus may comprise a control circuit arranged to cause a temporal displacement between times when the respective plurality of illumination sources illuminate a respective one of the plurality of alignment marks, and a demultiplexer configured to demultiplex light diffracted by the plurality of alignment marks based on a timing of receipt of the optical signal by the detection system. Respective ones of the plurality of illumination sources may be adapted to provide a plurality of light beams to illuminate respective ones of the plurality alignment marks with respective ones of the plurality of light beams having respective wavelengths that differ from one another, and wherein the apparatus further comprises a demultiplexer configured to demultiplex light diffracted by the plurality of alignment marks based on the wavelengths.

According to another aspect of an embodiment there is disclosed an apparatus for sensing alignment marks in an alignment pattern, the apparatus comprising an illumination system arranged to provide a first light beam to illuminate a first alignment mark, a second light beam to illuminate a second alignment mark, and a third light beam to illuminate a third alignment mark, a diffracted light gathering optical system arranged to gather diffracted light from the first alignment mark, the second alignment mark, and the third alignment mark, an interferometer arranged to receive the diffracted light gathered by the light gathering system and configured to generate an optical output based on the diffracted light, and a detection system arranged to receive the optical output of the self-referencing interferometer and configured to generate an electrical signal based on the optical output. The illumination system may comprise an illumination source for generating a source light beam, a first beam splitter arranged to receive the source light beam, to transmit a first transmitted portion of the source light beam, and to redirect a first redirected portion of the source light beam towards the first alignment marks, a second beam splitter arranged to receive the source light beam, to transmit a second transmitted portion of the source light beam, and to redirect a second redirected portion of the source light beam towards the second alignment marks, and a third beam splitter arranged to receive the source light beam and to redirect a third redirected portion of the source light beam towards the third alignment marks. The illumination system may be arranged to provide the first, second, and third light beams to provide on-axis illumination of respective ones of the first, second, and third alignment marks. The illumination system may be arranged to provide the first, second, and third light beams to provide off-axis illumination of respective ones of the first, second, and third alignment marks. The first alignment mark may comprise a first grating having a first pitch, the second alignment mark may comprise a second grating having a second pitch from the first pitch, and the third alignment mark may comprise a third grating having a third pitch different from the second pitch from the first pitch, and the apparatus may further comprise a demultiplexer configured to demultiplex light diffracted by the first grating, light diffracted by the second grating, and light diffracted by the third grating based on the first pitch, the second pitch, and the third pitch being different from one another. The apparatus may further comprise an arrangement for causing relative motion of the plurality of first, second, and third alignment marks and the diffracted light gathering optical system and a demultiplexer configured to demultiplex light diffracted by the first, second, and third alignment marks based on a timing of receipt of the optical signal by the detection system. The diffracted light gathering optical system may further comprise optical components arranged to create a lateral, with respect to a direction of propagation, physical separation between the respective diffracted light beams, and the apparatus may further comprise a demultiplexer configured to demultiplex light diffracted by the plurality of alignment marks based a lateral position of the light diffracted by the plurality of alignment marks. The illumination system may comprise a first, second, and third illumination sources arranged to provide a respective one of the first, second, and third light beams to illuminate a respective one of the first, second, and third alignment marks. The apparatus may further comprise a control circuit arranged to cause a temporal displacement between times when the respective one of the first, second, and third illumination sources illuminate a respective one of the first, second, and third alignment marks, and a demultiplexer configured to demultiplex light diffracted by the first, second, and third alignment marks based on a timing of receipt of the optical signal by the detection system. R respective ones of the first, second, and third illumination sources may be adapted to provide respective first, second, and third light beams to illuminate respective ones of the first, second, and third alignment marks with respective ones of the first, second, and third light beams having respective wavelengths that differ from one another, and the apparatus may further comprise a demultiplexer configured to demultiplex light diffracted by the first, second, and third alignment marks based on the wavelengths.

According to another aspect of an embodiment there is disclosed a method of sensing a plurality of alignment marks, the method comprising the steps of providing a plurality of light beams to illuminate respective ones of the plurality alignment marks, gathering diffracted light from a plurality of diffracted light beams diffracted from respective ones of the plurality of alignment marks, using an interferometer to receive the diffracted light gathered by the light gathering system and to generate an optical output based on the diffracted light, and generating an electrical signal based on the optical output. The step of providing a plurality of light beams to illuminate respective ones of the plurality alignment marks illumination system may comprise generating a source light beam, and providing a plurality of beam splitters arranged to receive the source light beam, to transmit a transmitted portion of the source light beam, and to redirect a redirected portion of the source light beam towards a respective one of the plurality of alignment marks. The step of providing a plurality of light beams to illuminate respective ones of the plurality alignment marks illumination system may comprise providing on-axis illumination of respective ones of the plurality alignment marks. The step of providing a plurality of light beams to illuminate respective ones of the plurality alignment marks illumination system may comprise providing off-axis illumination of respective ones of the plurality alignment marks. The plurality of alignment marks may comprise a first pair of alignment marks each comprising a first grating having a first pitch and a second pair of alignment marks each comprising a second grating having a second pitch different from the first pitch, and the method may further comprise a step of demultiplexing light diffracted by the first grating and light diffracted by the second grating based on the second pitch being different from the first pitch. The demultiplexer may demultiplex light diffracted by the first grating and light diffracted by the second grating by shifting a pupil position of the light diffracted by the first grating with respect to a pupil position of the light diffracted by the second grating. A first optical output of the light diffracted by the first grating demultiplexer may have a first frequency and a second optical output of the light diffracted by the second grating demultiplexer may have a second frequency different from the first frequency and the demultiplexer may demultiplex light diffracted by the first grating and light diffracted by the second grating based on first and second frequency. The step of gathering diffracted light from a plurality of diffracted light beams diffracted from respective ones of the plurality of alignment marks may be performed using a diffracted light gathering optical system and the method may further comprise the steps of causing relative motion of the plurality of alignment marks and the diffracted light gathering optical system and demultiplexing light diffracted by the plurality of alignment marks based on a timing of generating an electrical signal based on the optical output. Gathering diffracted light from a plurality of diffracted light beams diffracted from respective ones of the plurality of alignment marks may comprise creating a lateral, with respect to a direction of propagation, physical separation between the respective diffracted light beams, and the method may further comprise demultiplexing light diffracted by the plurality of alignment marks based on a lateral position of the light diffracted by the plurality of alignment marks. Providing a plurality of light beams to illuminate respective ones of the plurality alignment marks; the illumination system may comprise using a plurality of illumination sources arranged to provide a respective one of the plurality of light beams to illuminate a respective one of the plurality of alignment marks. The step of providing a plurality of light beams to illuminate respective ones of the plurality alignment marks may comprise causing a temporal displacement between times when the respective plurality of illumination sources illuminate a respective one of the plurality of alignment marks, and the method may further comprise demultiplexing light diffracted by the plurality of alignment marks based on a timing the optical output. The step of providing a plurality of light beams to illuminate respective ones of the plurality alignment marks may comprise providing a plurality of light beams to illuminate respective ones of the plurality alignment marks with respective ones of the plurality of light beams having respective wavelengths that differ from one another, and the method may further comprise demultiplexing light diffracted by the plurality of alignment marks based on the wavelengths.

According to another aspect of an embodiment there is disclosed an apparatus for sensing a plurality of alignment marks, the apparatus comprising an illumination system arranged to provide a plurality of light beams to illuminate respective ones of the plurality alignment marks, a diffracted light gathering optical system arranged to gather diffracted light from a plurality of diffracted light beams diffracted from respective ones of the plurality of alignment marks, a single interferometer arranged to receive the diffracted light gathered by the light gathering system and configured to generate an optical output based on the diffracted light, and a detection system arranged to receive the optical output of the and configured to generate an electrical signal based on the optical output.

According to another aspect of an embodiment there is disclosed a method of sensing a plurality of alignment marks, the method comprising the steps of providing a plurality of light beams to illuminate respective ones of the plurality alignment marks, gathering diffracted light from a plurality of diffracted light beams diffracted from respective ones of the plurality of alignment marks, using a single interferometer to receive the diffracted light gathered by the light gathering system and to generate an optical output based on the diffracted light, and generating an electrical signal based on the optical output.

Further embodiments, features, and advantages of the present invention, as well as the structure and operation of the various embodiments are described in detail below with reference to accompanying drawings.

BRIEF DESCRIPTION OF THE DRAWING

The accompanying drawings, which are incorporated herein and form part of the specification, illustrate the methods and systems of embodiments of the invention by way of example, and not by way of limitation. Together with the detailed description, the drawings further serve to explain the principles of and to enable a person skilled in the relevant art(s) to make and use the methods and systems presented herein. In the drawings, like reference numbers indicate identical or functionally similar elements.

Figure 1:
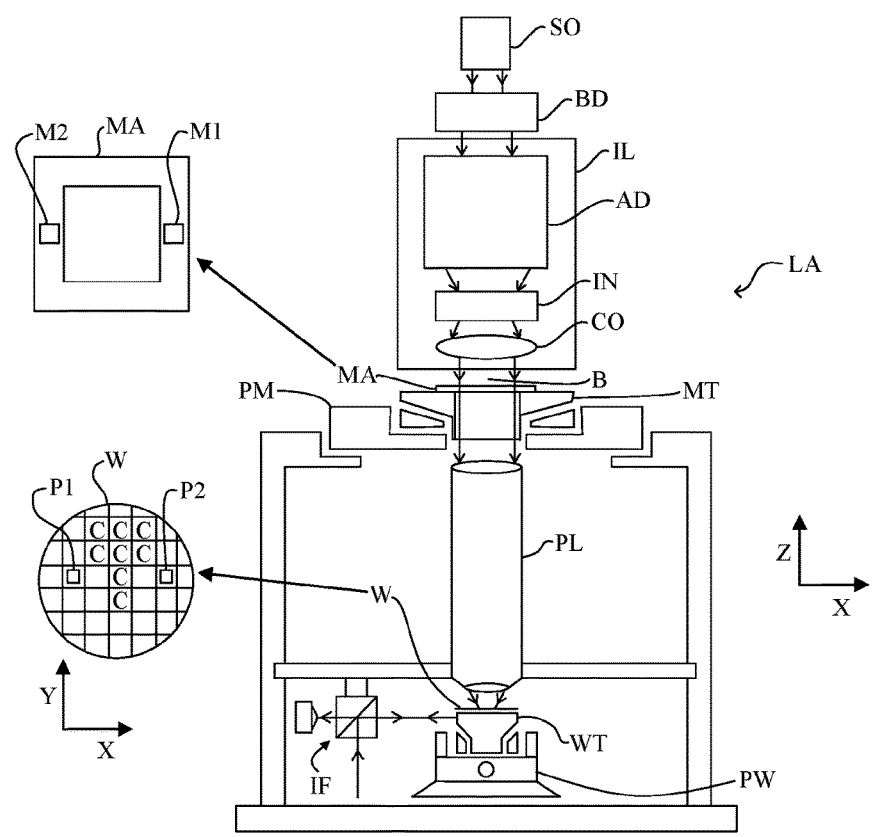
FIG. 1 depicts selected parts of a photolithography system such as could be used to according to aspects of an embodiment disclosed herein.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art based on the teachings contained herein.

DETAILED DESCRIPTION

Various embodiments are now described with reference to the drawings, wherein like reference numerals are used to refer to like elements throughout. In the following description, for purposes of explanation, numerous specific details are set forth in order to promote a thorough understanding of one or more embodiments. It may be evident in some or all instances, however, that any embodiment described below can be practiced without adopting the specific design details described below. In other instances, well-known structures and devices are shown in block diagram form in order to facilitate description of one or more embodiments. The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include solid state memory, read only memory (ROM), random access memory (RAM), magnetic disk storage media, optical storage media, flash memory devices; electrical, optical, acoustical or other forms of propagated signals (e.g., carrier waves, infrared signals, digital signals, etc.), and others. Further, firmware, software, routines, and instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts a lithographic apparatus. The apparatus comprises an illumination system (illuminator) IL configured to condition a radiation beam B (e.g., UV radiation or other suitable radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, electromagnetic, and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies. The wafer may also include additional marks such as, for example, marks that are sensitive to variations in a chemical mechanical planarization (CMP) process used as a step in wafer fabrication.

The target P1 and/or P2 on substrate W may be, for example, (a) a resist layer grating, which is printed such that after development, the bars are formed of solid resist lines, or (b) a product layer grating, or (c) a composite grating stack in an overlay target structure comprising a resist grating overlaid or interleaved on a product layer grating. The bars may alternatively be etched into the substrate.

Figure 2:
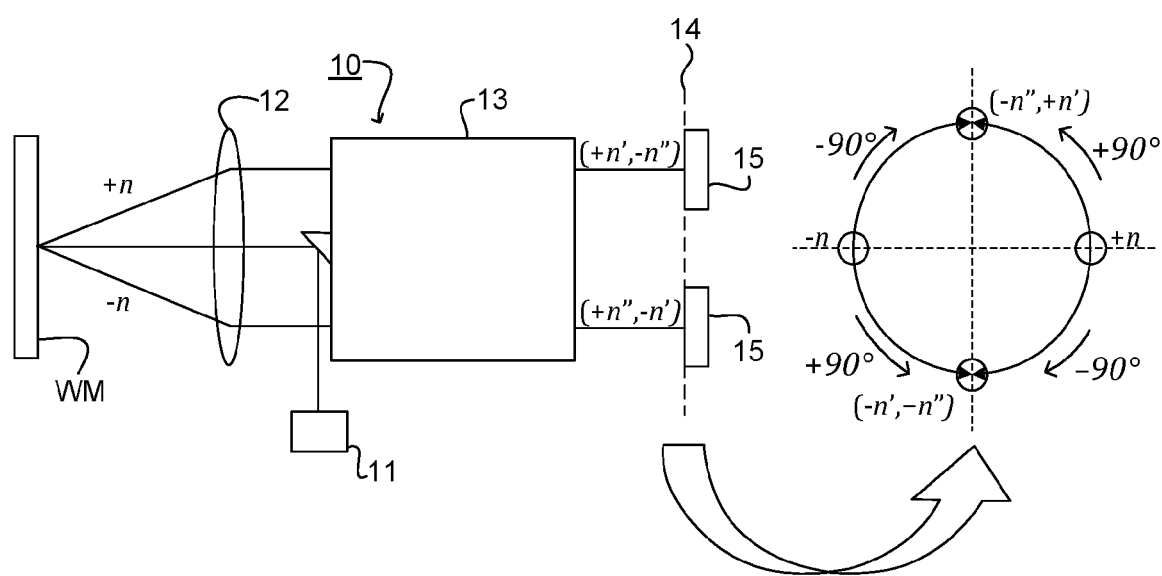
FIG. 2 depicts selected parts of a known alignment system for explaining the principles of its operation.

FIG. 2 shows a schematic overview of a known alignment system 10. A light source 11 emits a spatially coherent beam of radiation which illuminates an alignment marker WM on a substrate (e.g., a wafer) which reflects the radiation into positive and negative diffraction orders +n and −n. These diffraction orders are collimated by an objective lens 12 and enter a self-referencing interferometer (SRI) 13. The self-referencing interferometer outputs two images of the input with a relative rotation of 180° and which overlap and which can therefore be made to interfere. In a pupil plane 14, the overlapping Fourier transforms of these images, with the different diffraction orders separated can be seen and be made to interfere. Detectors 15 in the pupil plane detect the interfered diffraction orders to provide positional information. Based on this positional information a substrate can be aligned accurately with respect to a lithographic apparatus. The right-hand part of FIG. 2 shows the formation of two overlapping images in the pupil plane 14; for one image +n' and −n' are rotated by +90° relative to the input diffraction orders +n and −n; for the other image +n" and −n" are rotated by −90° relative to the input diffraction orders +n and −n. In the pupil plane the orders of respectively (+n' and −n"), and (+n" and −n') interfere.

The output of a sensor such as that just described is typically relayed to a detector that detects the pattern of intensities in the sensor output. In the alignment sensor the output sensor (a single pixel detector) detects the intensity variation arising from the interference between the + order and − order. This interference creates two channels, a SUM channel in which the electric fields are added and a DIFF channel in which the electric fields are subtracted. These two channels are 180 degrees out of phase with each other. The alignment position of the mark is computed by measuring the phase of the signal at the DIFF or SUM or a combination of the two channels. In such systems all of the light is directed to the detector.

As noted above, in accordance with an aspect of an embodiment in order to measure multiple marks substantially simultaneously the optical axis of the sensor is divided such that the sensor can simultaneously gather information from multiple positions on the wafer. The axis of an alignment of the sensor can be conceptualized as an imaginary line around which the rotation of the image occurs. The alignment sensors measure with respect to this axis. For systems which include an interferometer in the form of a self-referencing interferometer, this axis may be projected back from the self-referencing interferometer to the wafer through the objective lens of the optical system used to gather light diffracted by the alignment mark.

As described below, the axis of the interferometer can be split up, for example, by beam splitters into multiple different axes. The axis may, for example, be split into three axes. Three axes will be described below for the purposes of a specific example, but it will be apparent the axis could be split into a greater number of axes. Each of the multiple axes have their own objective and can have their own separate illumination. The signals from respective alignment marks can reach a common detector or separate detectors. The signals are demultiplexed to separate the alignment information from the three alignment marks on the wafer.

As described more fully below, demultiplexing of the signals can be performed using any one of a number of methods. For example, each of the three different marks on the wafer, which have a grating with a given pitch, can have different pitches. In this case, the signal can be separated spatially or by frequency, for example, using a Fourier decomposition. Demultiplexing the signals can also be accomplished by using optics such as optical mirrors and prisms in the pupil plane at the detector which can direct the signal from each channel and separate the signals spatially. Here the signals are separated laterally, that is, in a direction lateral to the direction of propagation of the light. Separate detectors may be used in this configuration. Alternatively, the illumination of the marks can be multiplexed in time, and the signals can be separated by gating the time interval of the detector. Alternatively, the alignment marks may be illuminated with light having differing wavelengths and the signals from the alignment marks can be separated by frequency.

In these arrangements it is possible to measure multiple alignment marks using a single self-referencing interferometer.

Figure 3:
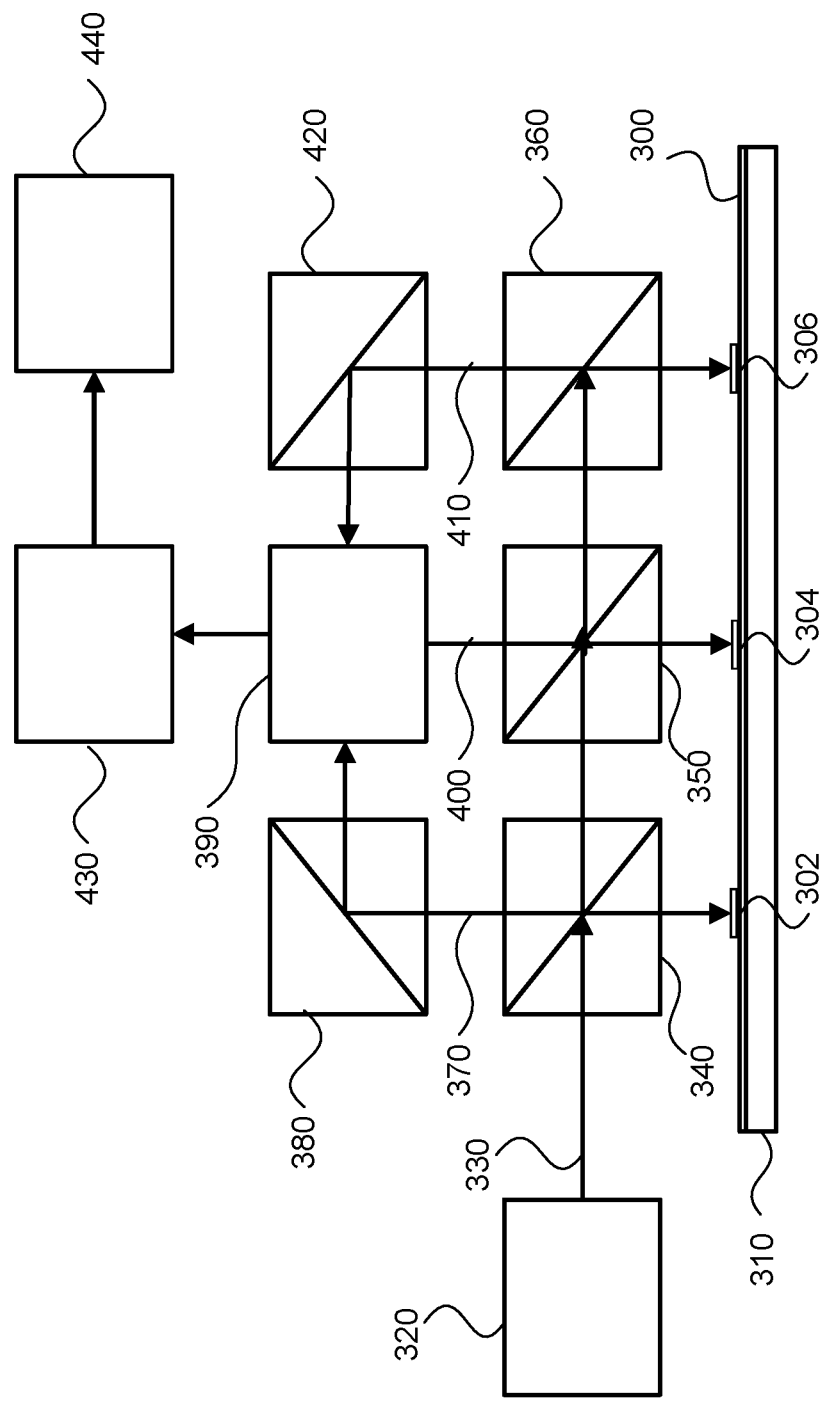
FIG. 3 depicts a system for analyzing alignment marks according to an aspect of an embodiment.

On example of a system in accordance with an aspect of an embodiment is shown in FIG. 3. As shown in FIG. 3, an alignment pattern 300 made up of alignment marks 302, 304, and 306 is provided on a substrate 310. The light source 320 generates a light beam 330. A first beam splitter 340 splits the beam 330 into a first component which is directed toward alignment mark 302 in the alignment pattern 300 and a second part which propagates onward. It will be understood that this and other beam splitters described here may advantageously include an objective. The second part reaches a second beam splitter 350 which directs part of the beam toward an alignment mark 304 and the other part towards a third beam splitter 360. The third beam splitter 360 directs the portion of the beam that it receives to a third alignment mark 306.

In each case, the portion of the beam that reaches the alignment mark is diffracted by the alignment mark. The diffracted light propagates back through the beam splitters. The light 370 diffracted by alignment mark 302 hits a folding mirror 380 and is directed toward an axis splitter 390. Similarly, the light 400 diffracted by the second alignment mark 304 is relayed to the axis splitter 390 and the light 410 is relayed to the axis splitter 390 by a folding mirror 420. The output of the axis splitter 390 reaches a self-referencing interferometer 430. The optical output of the self-referencing interferometer 430 is supplied to a detector 440. The light 370, 400, and 410 in this embodiment is a pair of beams, i.e., these numerals designate not a single beam but the path of the pair of diffraction orders.

Figure 4A:
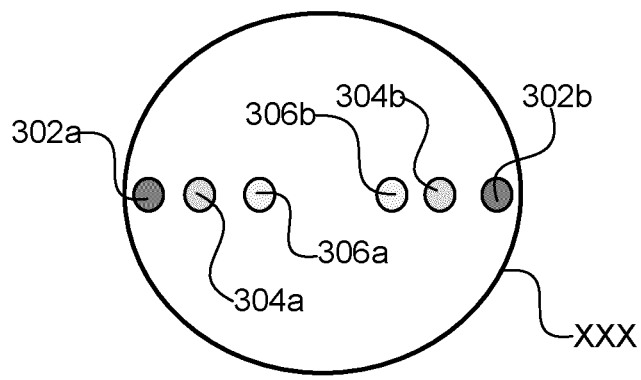
FIG. 4A depicts alignment marks adapted to be measured according to an aspect of an embodiment.

Various methods may be employed to segregate the signals from the various alignment marks. For example, the alignment marks 302, 304, and 306 in FIG. 3 may be gratings having different pitches. FIG. 4A shows the diffraction orders in the pupil after 390 in FIG. 3. Because the pitches of 302, 304 and 306 are different they diffract to show the different order pairs, that is pair 302a and 302b, pair 304a and 304b, and pair 306a, 306b. In this way, the signals from these pairs of alignment marks can be differentiated. The signals can also be separated spectrally, for example, by Fourier decomposition.

Figure 4B:
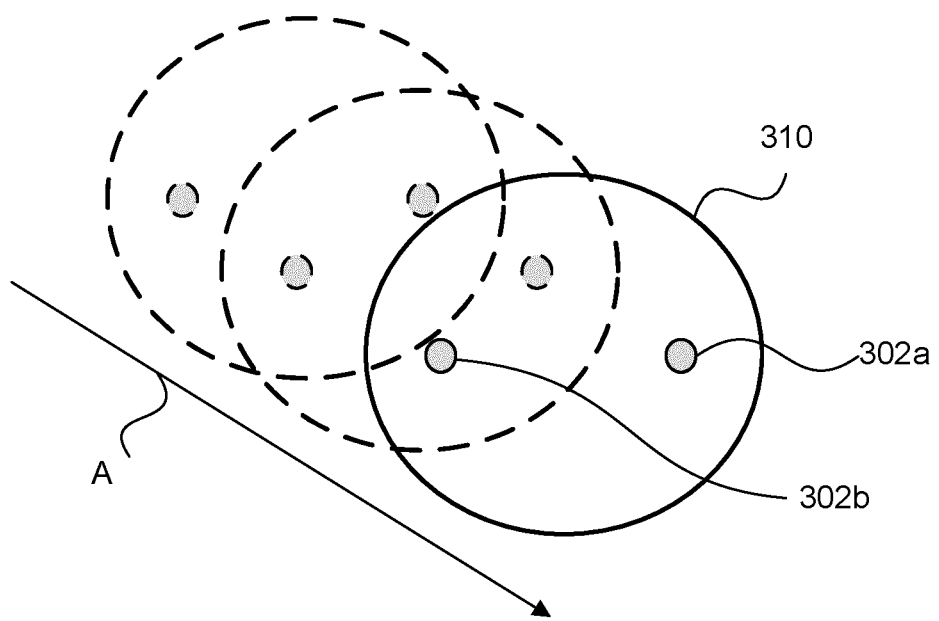
FIG. 4B depicts alignment marks adapted to be measured according to an aspect of an embodiment as shown in FIG. 5.
Figure 5:
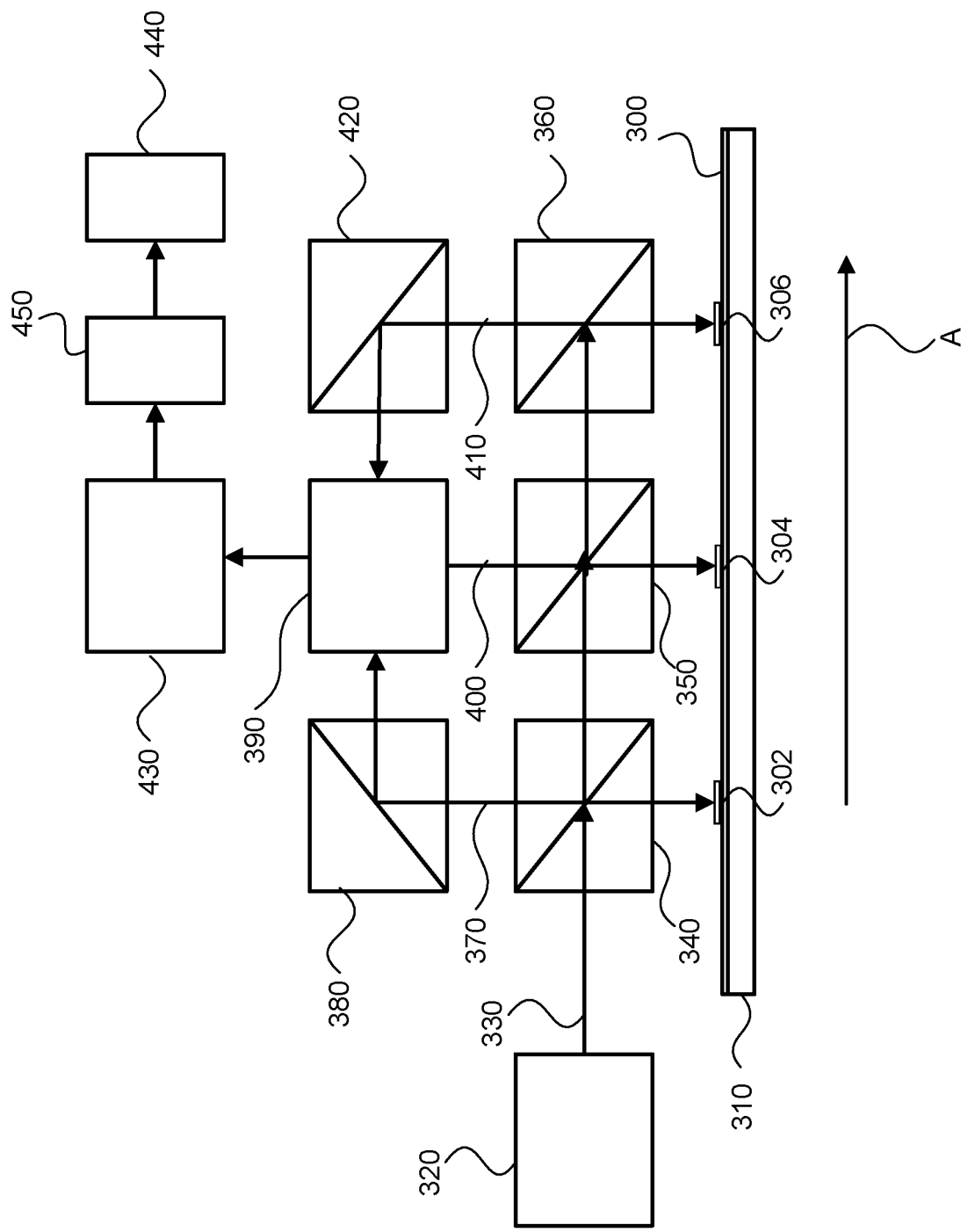
FIG. 5 depicts a system for analyzing alignment marks according to an aspect of an embodiment.

The signals may also be segregated temporally. An arrangement for accomplishing this is shown in FIGS. 4B and 5. In FIG. 4B, there is relative motion in the direction indicated by the arrow A between the substrate 310 bearing the alignment marks 302a and 302b and the optical system which collects the diffracted light and which includes the beam splitters as shown in FIG. 5. The arrangement of FIG. 5 additionally includes a light gate 450 which permits passage to the detector 440 of the optical output of the self-referencing interferometer 430 only at a time when the alignment marks 302a, 302b are known to be in areas where they diffract the light from the source 320. By synchronizing this activity, the alignment mark giving rise to the optical signal reaching the detector 440 can be identified.

Figure 6:
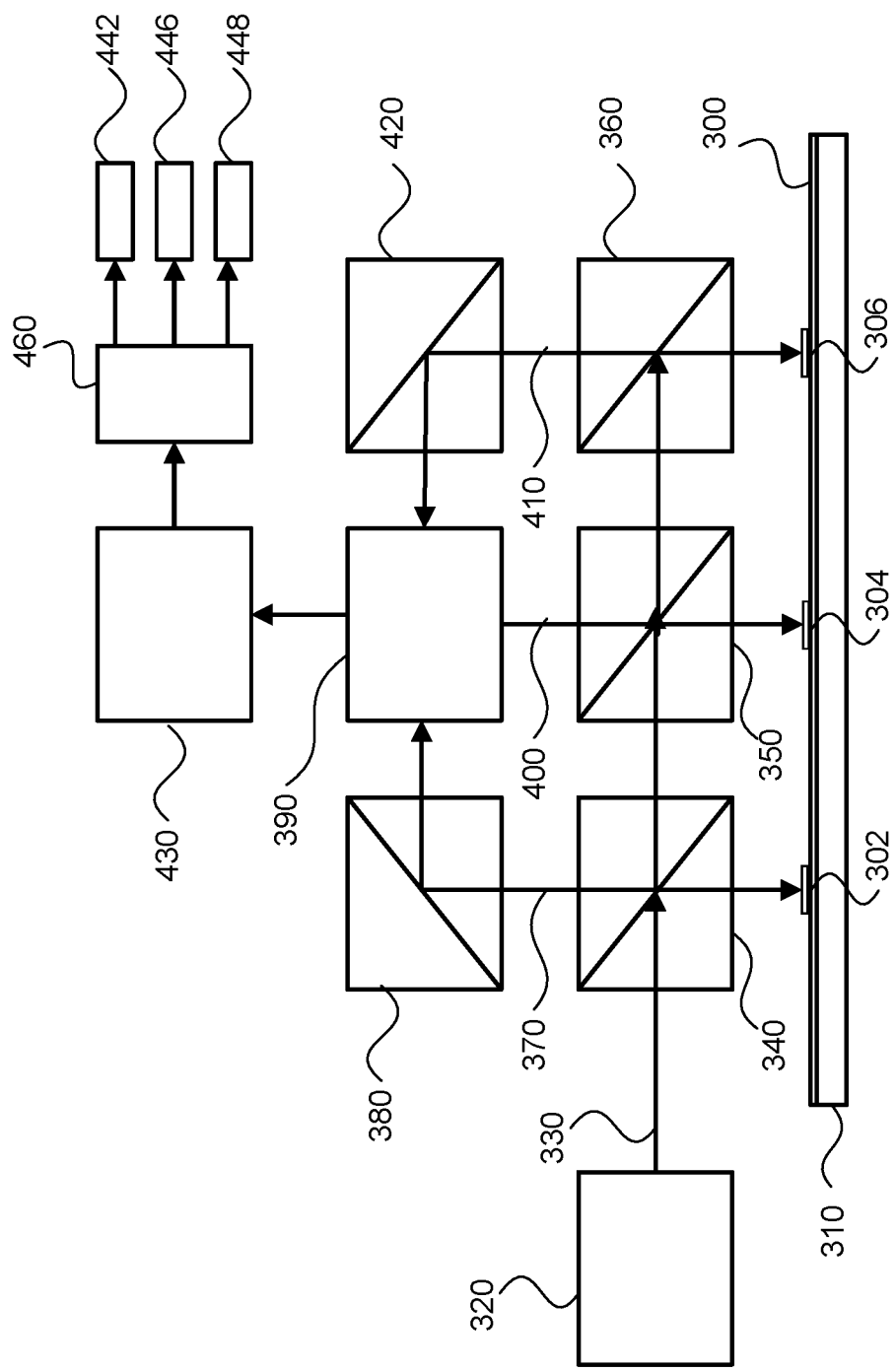
FIG. 6 depicts a system for analyzing alignment marks according to an aspect of an embodiment.

Alternatively, as shown in FIG. 6, demultiplexing the signals can also be accomplished by using optics 460 such as optical mirrors and prisms in the pupil plane which can direct the signal from each channel and separate the signals spatially. Here the signals are separated laterally, that is, in a direction lateral to the direction of propagation of the light. Separate detectors 442, 446, and 448 may be used in this configuration as shown, or single camera with multiple detectors may be used.

Figure 7:
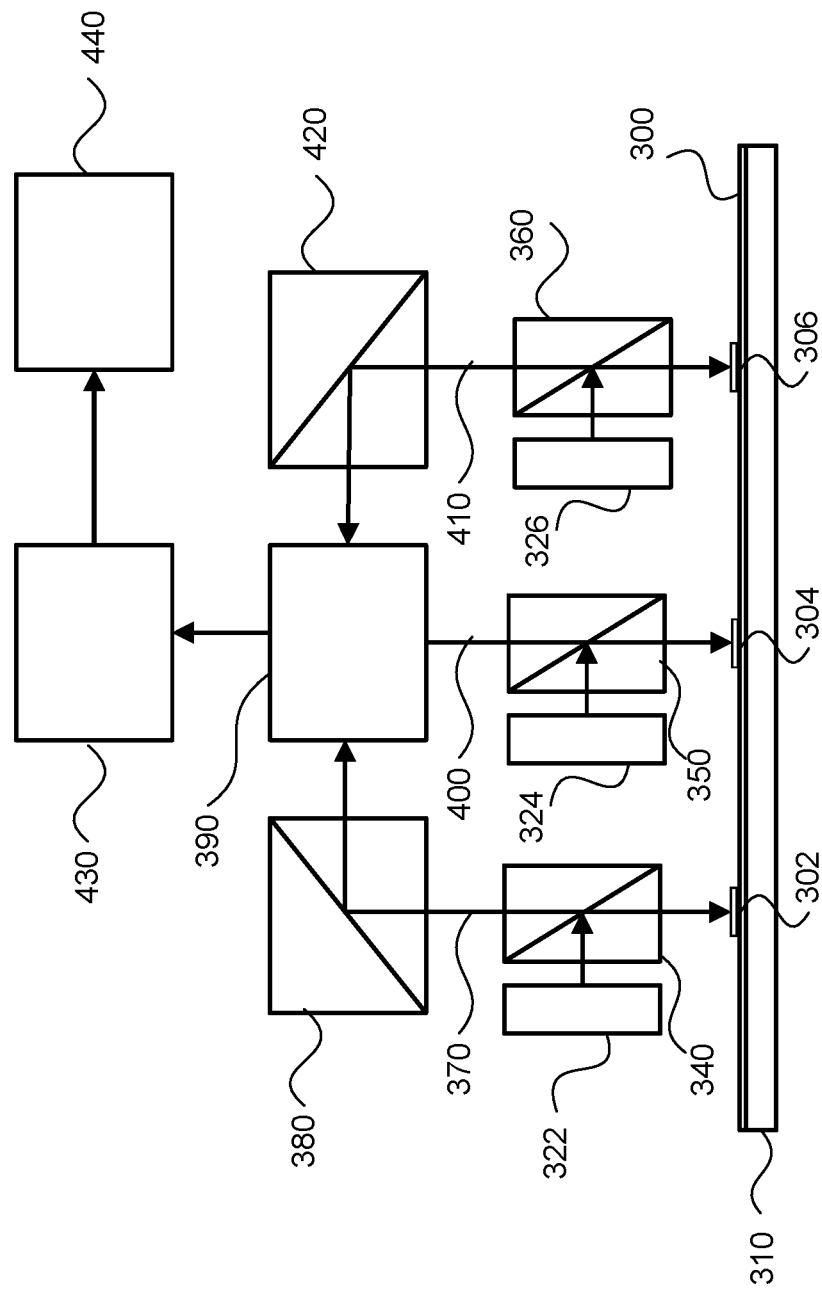
FIG. 7 depicts a system for analyzing alignment marks according to an aspect of an embodiment.

Each of the individual alignment marks may be provided with a separate illuminator such as a shown in FIG. 7. In FIG. 7, illuminator 322 illuminates alignment mark 302. Similarly, illuminator 324 illuminates alignment mark 304 and illuminator 326 illuminates alignment mark 306. This permits temporal segregation of the signals reaching the detector 440. In other words, if only one of the illuminators is illuminating an alignment mark, then the optical signal reaching the detector 440 at that time is the signal arising from illumination of the alignment mark. Also, the illuminators could be configured into provide illumination having differing wavelengths. This illumination of different wavelengths can then be differentiated at the detector using spectral filters. Alternatively, multiple detectors can be employed, one for each wavelength.

Figure 8:
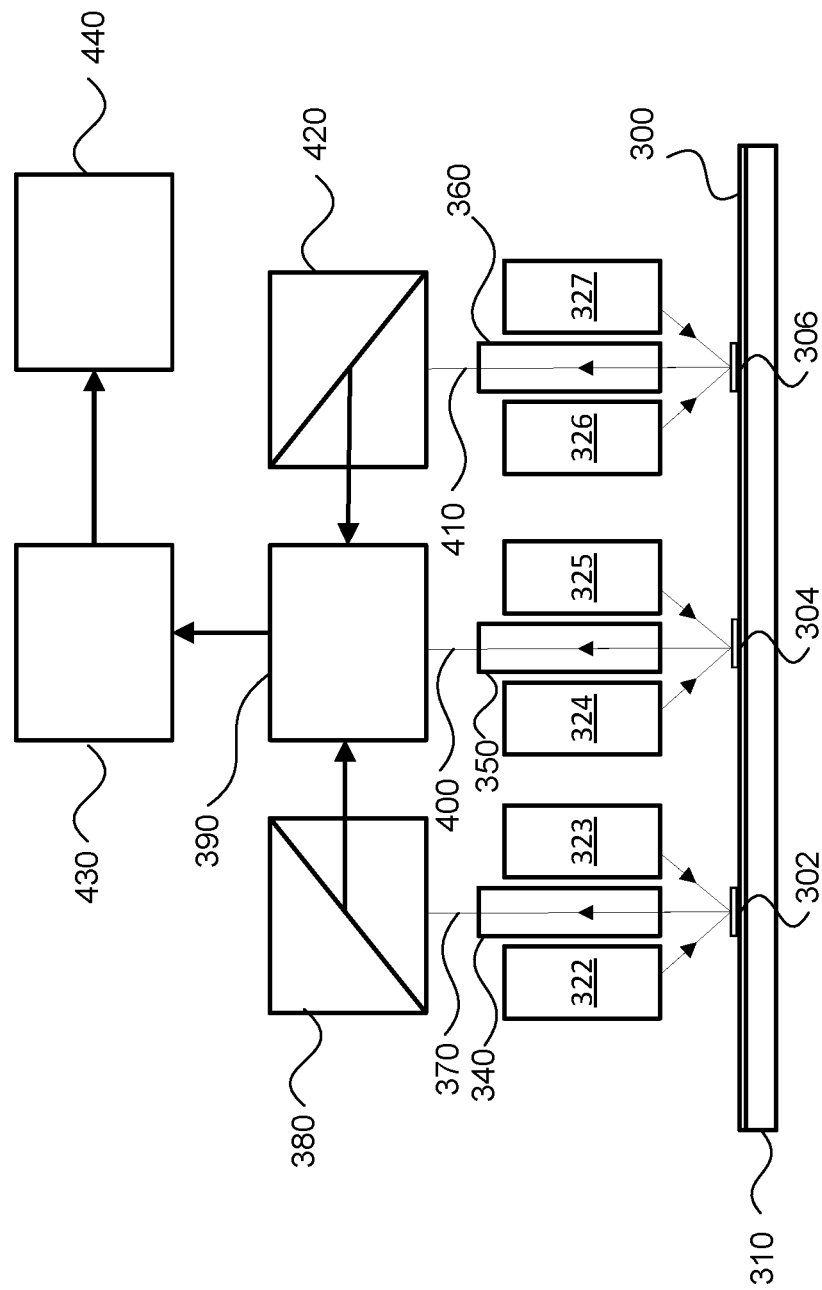
FIG. 8 depicts a system for analyzing alignment marks according to an aspect of an embodiment.

In the examples described above, on-axis illumination is used to illuminate the alignment marks. FIG. 8 shows an arrangement in which off-axis illumination is used. In other words, the illumination comes in at an angle to the alignment mark and to the optical axis of the detector. The incoming light strikes the photomask at an oblique angle rather than perpendicularly to it, that is to say, the incident light is not parallel to the axis of the optical system. This permits measurement of marks with a smaller pitch. Off-axis illumination can be used with any of the arrangements described above. As shown the off-axis illumination is left-right symmetric so that illuminators 322 and 323 illuminate alignment mark 302. Similarly, illuminators 324 and 325 illuminate alignment mark 304 and illuminator 326 and 327 illuminate alignment mark 306.

Other aspects of the invention are set out in the following numbered clauses.

1. Apparatus for sensing a plurality of alignment marks, the apparatus comprising:
   an illumination system arranged to provide a plurality of light beams to illuminate respective ones of the plurality alignment marks;
   a diffracted light gathering optical system arranged to gather diffracted light from a plurality of diffracted light beams diffracted from respective ones of the plurality of alignment marks;
   an interferometer arranged to receive the diffracted light gathered by the light gathering system and configured to generate an optical output based on the diffracted light; and
   a detection system arranged to receive the optical output of the and configured to generate an electrical signal based on the optical output.

2. Apparatus of clause 1 wherein the illumination system comprises:
   an illumination source for generating a source light beam; and
   a plurality of beam splitters arranged to receive the source light beam, to transmit a transmitted portion of the source light beam, and to redirect a redirected portion of the source light beam towards a respective one of the plurality of alignment marks.

3. Apparatus of clause 1 wherein the illumination system is arranged to provide the plurality of light beams to provide on-axis illumination of respective ones of the plurality alignment marks.

4. Apparatus of clause 1 wherein the illumination system is arranged to provide the plurality of light beams to provide off-axis illumination of respective ones of the plurality alignment marks.

5. Apparatus of clause 1 wherein the plurality of alignment marks comprises a first pair of alignment marks each comprising a first grating having a first pitch and a second pair of alignment marks each comprising a second grating having a second pitch different from the first pitch, and wherein the apparatus further comprises a demultiplexer configured to demultiplex light diffracted by the first grating and light diffracted by the second grating based on the second pitch being different from the first pitch.

6. Apparatus of clause 5 wherein the demultiplexer is configured to demultiplex light diffracted by the first grating and light diffracted by the second grating by shifting a pupil position of the light diffracted by the first grating with respect to a pupil position of the light diffracted by the second grating.

7. Apparatus of clause 5 wherein a first optical output of the light diffracted by the first grating demultiplexer has a first frequency and a second optical output of the light diffracted by the second grating demultiplexer has a second frequency different from the first frequency and wherein the demultiplexer is configured to demultiplex light diffracted by the first grating and light diffracted by the second grating based on first and second frequency.

8. Apparatus of clause 1 further comprising
   an arrangement for causing relative motion of the plurality of alignment marks and the diffracted light gathering optical system and
   a demultiplexer configured to demultiplex light diffracted by the plurality of alignment marks based on a timing of receipt of the optical signal by the detection system.

9. Apparatus of clause 1 wherein the diffracted light gathering optical system further comprises optical components arranged to create a lateral, with respect to a direction of propagation, physical separation between the respective diffracted light beams,
   and wherein the apparatus further comprises a demultiplexer configured to demultiplex light diffracted by the plurality of alignment marks based on a lateral position of the light diffracted by the plurality of alignment marks.

10. Apparatus of clause 1 wherein the illumination system comprises a plurality of illumination sources arranged to provide a respective one of the plurality of light beams to illuminate a respective one of the plurality of alignment marks.

11. Apparatus of clause 10 further comprising a control circuit arranged to cause a temporal displacement between times when the respective plurality of illumination sources illuminate a respective one of the plurality of alignment marks, and
   a demultiplexer configured to demultiplex light diffracted by the plurality of alignment marks based on a timing of receipt of the optical signal by the detection system.

12. Apparatus of clause 10 wherein the respective ones of the plurality of illumination sources are adapted to provide a plurality of light beams to illuminate respective ones of the plurality alignment marks with respective ones of the plurality of light beams having respective wavelengths that differ from one another, and wherein the apparatus further comprises a demultiplexer configured to demultiplex light diffracted by the plurality of alignment marks based on the wavelengths.

13. Apparatus for sensing alignment marks in an alignment pattern, the apparatus comprising:
   an illumination system arranged to provide a first light beam to illuminate a first alignment mark, a second light beam to illuminate a second alignment mark, and a third light beam to illuminate a third alignment mark;
   a diffracted light gathering optical system arranged to gather diffracted light from the first alignment mark, the second alignment mark, and the third alignment mark;
   an interferometer arranged to receive the diffracted light gathered by the light gathering system and configured to generate an optical output based on the diffracted light; and
   a detection system arranged to receive the optical output of the self-referencing interferometer and configured to generate an electrical signal based on the optical output.

14. Apparatus of clause 13 wherein the illumination system comprises:
   an illumination source for generating a source light beam;
   a first beam splitter arranged to receive the source light beam, to transmit a first transmitted portion of the source light beam, and to redirect a first redirected portion of the source light beam towards the first alignment marks;
   a second beam splitter arranged to receive the source light beam, to transmit a second transmitted portion of the source light beam, and to redirect a second redirected portion of the source light beam towards the second alignment marks; and
   a third beam splitter arranged to receive the source light beam and to redirect a third redirected portion of the source light beam towards the third alignment marks.

15. Apparatus of clause 13 wherein the illumination system is arranged to provide the first, second, and third light beams to provide on-axis illumination of respective ones of the first, second, and third alignment marks.

16. Apparatus of clause 13 wherein the illumination system is arranged to provide the first, second, and third light beams to provide off-axis illumination of respective ones of the first, second, and third alignment marks.

17. Apparatus of clause 13 wherein the first alignment mark comprises a first grating having a first pitch, the second alignment mark comprises a second grating having a second pitch from the first pitch, and the third alignment mark comprises a third grating having a third pitch different from the second pitch from the first pitch, and
   wherein the apparatus further comprises a demultiplexer configured to demultiplex light diffracted by the first grating, light diffracted by the second grating, and light diffracted by the third grating based on the first pitch, the second pitch, and the third pitch being different from one another.

18. Apparatus of clause 13 further comprising
   an arrangement for causing relative motion of the plurality of first, second, and third alignment marks and the diffracted light gathering optical system and
   a demultiplexer configured to demultiplex light diffracted by the first, second, and third alignment marks based on a timing of receipt of the optical signal by the detection system.

19. Apparatus of clause 13 wherein the diffracted light gathering optical system further comprises optical components arranged to create a lateral, with respect to a direction of propagation, physical separation between the respective diffracted light beams,
   and wherein the apparatus further comprises a demultiplexer configured to demultiplex light diffracted by the plurality of alignment marks based a lateral position of the light diffracted by the plurality of alignment marks.

20. Apparatus of clause 13 wherein the illumination system comprises a first, second, and third illumination sources arranged to provide a respective one of the first, second, and third light beams to illuminate a respective one of the first, second, and third alignment marks.

21. Apparatus of clause 20 further comprising a control circuit arranged to cause a temporal displacement between times when the respective one of the first, second, and third illumination sources illuminate a respective one of the first, second, and third alignment marks, and
   a demultiplexer configured to demultiplex light diffracted by the first, second, and third alignment marks based on a timing of receipt of the optical signal by the detection system.

22. Apparatus of clause 20 wherein the respective ones of the first, second, and third illumination sources are adapted to provide respective first, second, and third light beams to illuminate respective ones of the first, second, and third alignment marks with respective ones of the first, second, and third light beams having respective wavelengths that differ from one another, and wherein the apparatus further comprises a demultiplexer configured to demultiplex light diffracted by the first, second, and third alignment marks based on the wavelengths.

23. A method of sensing a plurality of alignment marks, the method comprising the steps of:
   providing a plurality of light beams to illuminate respective ones of the plurality alignment marks;
   gathering diffracted light from a plurality of diffracted light beams diffracted from respective ones of the plurality of alignment marks;
   using an interferometer to receive the diffracted light gathered by the light gathering system and to generate an optical output based on the diffracted light; and
   generating an electrical signal based on the optical output.

24. A method of sensing a plurality of alignment marks of clause 23 wherein the step of providing a plurality of light beams to illuminate respective ones of the plurality alignment marks illumination system comprises
   generating a source light beam, and
   providing a plurality of beam splitters arranged to receive the source light beam, to transmit a transmitted portion of the source light beam, and to redirect a redirected portion of the source light beam towards a respective one of the plurality of alignment marks.

25. A method of sensing a plurality of alignment marks of clause 23 wherein the step of providing a plurality of light beams to illuminate respective ones of the plurality alignment marks illumination system comprises providing on-axis illumination of respective ones of the plurality alignment marks.

26. A method of sensing a plurality of alignment marks of clause 23 wherein the step of providing a plurality of light beams to illuminate respective ones of the plurality alignment marks illumination system comprises providing off-axis illumination of respective ones of the plurality alignment marks.

27. A method of sensing a plurality of alignment marks of clause 23 wherein the plurality of alignment marks comprises a first pair of alignment marks each comprising a first grating having a first pitch and a second pair of alignment marks each comprising a second grating having a second pitch different from the first pitch, and wherein the method further comprises a step of demultiplexing light diffracted by the first grating and light diffracted by the second grating based on the second pitch being different from the first pitch.

28. A method of sensing a plurality of alignment marks of clause 27 wherein the demultiplexer demultiplexes light diffracted by the first grating and light diffracted by the second grating by shifting a pupil position of the light diffracted by the first grating with respect to a pupil position of the light diffracted by the second grating.

29. A method of sensing a plurality of alignment marks of clause 27 wherein a first optical output of the light diffracted by the first grating demultiplexer has a first frequency and a second optical output of the light diffracted by the second grating demultiplexer has a second frequency different from the first frequency and wherein the demultiplexer demultiplexes light diffracted by the first grating and light diffracted by the second grating based on first and second frequency.

30. A method of sensing a plurality of alignment marks of clause 23 wherein the step of gathering diffracted light from a plurality of diffracted light beams diffracted from respective ones of the plurality of alignment marks is performed using a diffracted light gathering optical system and wherein the method further comprises the steps of
   causing relative motion of the plurality of alignment marks and the diffracted light gathering optical system and
   demultiplexing light diffracted by the plurality of alignment marks based on a timing of generating an electrical signal based on the optical output.

31. A method of sensing a plurality of alignment marks of clause 23 wherein gathering diffracted light from a plurality of diffracted light beams diffracted from respective ones of the plurality of alignment marks comprises creating a lateral, with respect to a direction of propagation, physical separation between the respective diffracted light beams, and
   and wherein the method further comprises demultiplexing light diffracted by the plurality of alignment marks based on a lateral position of the light diffracted by the plurality of alignment marks.

32. A method of sensing a plurality of alignment marks of clause 23 wherein providing a plurality of light beams to illuminate respective ones of the plurality alignment marks; the illumination system comprises using a plurality of illumination sources arranged to provide a respective one of the plurality of light beams to illuminate a respective one of the plurality of alignment marks.

33. A method of sensing a plurality of alignment marks of clause 23 wherein the step of providing a plurality of light beams to illuminate respective ones of the plurality alignment marks comprises causing a temporal displacement between times when the respective plurality of illumination sources illuminate a respective one of the plurality of alignment marks, and
   wherein the method further comprises demultiplexing light diffracted by the plurality of alignment marks based on a timing the optical output.

34. A method of sensing a plurality of alignment marks of clause 23 wherein the step of providing a plurality of light beams to illuminate respective ones of the plurality alignment marks comprises providing a plurality of light beams to illuminate respective ones of the plurality alignment marks with respective ones of the plurality of light beams having respective wavelengths that differ from one another, and wherein the method further comprises demultiplexing light diffracted by the plurality of alignment marks based on the wavelengths.

35. Apparatus for sensing a plurality of alignment marks, the apparatus comprising:
   an illumination system arranged to provide a plurality of light beams to illuminate respective ones of the plurality alignment marks;
   a diffracted light gathering optical system arranged to gather diffracted light from a plurality of diffracted light beams diffracted from respective ones of the plurality of alignment marks;
   a single interferometer arranged to receive the diffracted light gathered by the light gathering system and configured to generate an optical output based on the diffracted light; and
   a detection system arranged to receive the optical output of the and configured to generate an electrical signal based on the optical output.

36. A method of sensing a plurality of alignment marks, the method comprising the steps of:
   providing a plurality of light beams to illuminate respective ones of the plurality alignment marks;
   gathering diffracted light from a plurality of diffracted light beams diffracted from respective ones of the plurality of alignment marks;
   using a single interferometer to receive the diffracted light gathered by the light gathering system and to generate an optical output based on the diffracted light; and
   generating an electrical signal based on the optical output.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion," respectively.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. An apparatus for sensing a plurality of alignment marks, the apparatus comprising:
    an illumination system configured to provide a plurality of light beams to illuminate respective ones of the plurality of alignment marks;
    a diffracted light gathering optical system configured to receive diffracted light from a plurality of diffracted light beams diffracted from respective ones of the plurality of alignment marks;
    an interferometer configured to receive the diffracted light received by the diffracted light gathering optical system and configured to generate an optical output based on the diffracted light;
    a detection system configured to receive the optical output of the interferometer and configured to generate an electrical signal based on the optical output;
    an arrangement configured to cause relative motion of the plurality of alignment marks and the diffracted light gathering optical system; and
    a demultiplexer configured to demultiplex light diffracted by the plurality of alignment marks based on a timing of receipt of the electrical signal by the detection system.

2. The apparatus of claim 1, wherein the illumination system comprises:
    an illumination source for generating a source light beam; and
    a plurality of beam splitters configured to receive the source light beam, to transmit a transmitted portion of the source light beam, and to redirect a redirected portion of the source light beam towards a respective one of the plurality of alignment marks.

3. The apparatus of claim 1, wherein the illumination system is configured to provide the plurality of light beams to provide on-axis illumination of respective ones of the plurality alignment marks.

4. The apparatus of claim 1, wherein the illumination system is configured to provide the plurality of light beams to provide off-axis illumination of respective ones of the plurality alignment marks.

5. The apparatus of claim 1, wherein:
    the plurality of alignment marks comprises a first pair of alignment marks, each comprising a first grating having a first pitch, and a second pair of alignment marks, each comprising a second grating having a second pitch different from the first pitch, and
    the demultiplexer is further configured to demultiplex light diffracted by the first grating and light diffracted by the second grating based on the second pitch being different from the first pitch.

6. The apparatus of claim 5, wherein the demultiplexer is configured to demultiplex light diffracted by the first grating and light diffracted by the second grating by shifting a pupil position of the light diffracted by the first grating with respect to a pupil position of the light diffracted by the second grating.

7. The apparatus of claim 5, wherein:
    a first optical output of the light diffracted by the first grating has a first frequency;
    a second optical output of the light diffracted by the second grating has a second frequency, different from the first frequency, and
    the demultiplexer is configured to demultiplex light diffracted by the first grating and light diffracted by the second grating based on the first and second frequencies.

8. The apparatus of claim 1, wherein:
    the diffracted light gathering optical system further comprises optical components configured to create a lateral, with respect to a direction of propagation, physical separation between the respective diffracted light beams, and
    the demultiplexer is further configured to demultiplex light diffracted by the plurality of alignment marks based on a lateral position of the light diffracted by the plurality of alignment marks.

9. The apparatus of claim 1, wherein the illumination system comprises a plurality of illumination sources configured to provide a respective one of the plurality of light beams to illuminate a respective one of the plurality of alignment marks.

10. The apparatus of claim 9, further comprising:
    a control circuit configured to cause a temporal displacement between times when the respective plurality of illumination sources illuminate a respective one of the plurality of alignment marks.

11. The apparatus of claim 9, wherein:
the respective ones of the plurality of illumination sources are adapted to provide a plurality of light beams to illuminate respective ones of the plurality alignment marks with respective ones of the plurality of light beams having respective wavelengths that differ from one another, and
the demultiplexer is further configured to demultiplex light diffracted by the plurality of alignment marks based on the wavelengths.

12. The apparatus of claim 1, further comprising a light gate disposed between the interferometer and the detection system to determine the timing of receipt of the electrical signal by the detection system.

13. An apparatus for sensing alignment marks in an alignment pattern, the apparatus comprising:
an illumination system configured to provide a first light beam to illuminate a first alignment mark, a second light beam to illuminate a second alignment mark, and a third light beam to illuminate a third alignment mark;
a diffracted light gathering optical system configured to receive diffracted light from the first alignment mark, the second alignment mark, and the third alignment mark;
an interferometer configured to receive the diffracted light gathered by the diffracted light gathering optical system and configured to generate an optical output based on the diffracted light;
a detection system configured to receive the optical output of the interferometer and configured to generate an electrical signal based on the optical output;
an arrangement configured to cause relative motion of the plurality of first, second, and third alignment marks and the diffracted light gathering optical system; and
a demultiplexer configured to demultiplex light diffracted by the first, second, and third alignment marks based on a timing of receipt of the electrical signal by the detection system.

14. The apparatus of claim 13, wherein the illumination system comprises:
an illumination source configured to generate a source light beam;
a first beam splitter configured to receive the source light beam, to transmit a first transmitted portion of the source light beam, and to redirect a first redirected portion of the source light beam towards the first alignment marks;
a second beam splitter configured to receive the source light beam, to transmit a second transmitted portion of the source light beam, and to redirect a second redirected portion of the source light beam towards the second alignment marks; and
a third beam splitter configured to receive the source light beam and to redirect a third redirected portion of the source light beam towards the third alignment marks.

15. The apparatus of claim 13, wherein the illumination system is configured to provide the first, second, and third light beams to provide on-axis illumination of respective ones of the first, second, and third alignment marks.

16. The apparatus of claim 13, wherein the illumination system is configured to provide the first, second, and third light beams to provide off-axis illumination of respective ones of the first, second, and third alignment marks.

17. The apparatus of claim 13, wherein:
the first alignment mark comprises a first grating having a first pitch, the second alignment mark comprises a second grating having a second pitch different from the first pitch, and the third alignment mark comprises a third grating having a third pitch different from the second pitch and different from the first pitch, and
the demultiplexer is further configured to demultiplex light diffracted by the first grating, light diffracted by the second grating, and light diffracted by the third grating based on the first pitch, the second pitch, and the third pitch being different from one another.

18. The apparatus of claim 13, wherein:
the diffracted light gathering optical system further comprises optical components configured to create a lateral, with respect to a direction of propagation, physical separation between the respective diffracted light beams, and
the demultiplexer is further configured to demultiplex light diffracted by the plurality of alignment marks based a lateral position of the light diffracted by the plurality of alignment marks.

19. The apparatus of claim 13, wherein the illumination system comprises first, second, and third illumination sources configured to provide a respective one of the first, second, and third light beams to illuminate a respective one of the first, second, and third alignment marks.

20. The apparatus of claim 13, further comprising a light gate disposed between the interferometer and the detection system to determine the timing of receipt of the electrical signal by the detection system.

\* \* \* \* \*